(12) United States Patent
Elsass et al.

(10) Patent No.: US 7,728,377 B2
(45) Date of Patent: Jun. 1, 2010

(54) VARACTOR DESIGN USING AREA TO PERIMETER RATIO FOR IMPROVED TUNING RANGE

(75) Inventors: Christopher R. Elsass, Santa Barbara, CA (US); Robert Armstrong York, Santa Barbara, CA (US)

(73) Assignee: Agile RF, Inc., Goleta, CA (US)

( * ) Notice: Subject to any disclaimer, the term of this patent is extended or adjusted under 35 U.S.C. 154(b) by 248 days.

(21) Appl. No.: 11/511,568

(22) Filed: Aug. 28, 2006

(65) Prior Publication Data

US 2007/0069274 A1    Mar. 29, 2007

Related U.S. Application Data

(60) Provisional application No. 60/719,791, filed on Sep. 23, 2005.

(51) Int. Cl.
    *H01L 29/94*    (2006.01)
(52) U.S. Cl. .................. 257/312; 257/595
(58) Field of Classification Search ............ 257/312, 257/595, E27.049, E29.344
    See application file for complete search history.

(56) References Cited

U.S. PATENT DOCUMENTS

| 2,802,171 | A |   | 8/1957  | Minder           |
|-----------|---|---|---------|------------------|
| 3,562,637 | A |   | 2/1971  | Gikow            |
| 5,038,184 | A | * | 8/1991  | Chiang et al. ........ 257/312 |
| 5,273,609 | A |   | 12/1993 | Moslehi          |
| 5,489,548 | A |   | 2/1996  | Nishioka et al.  |
| 5,593,914 | A |   | 1/1997  | Evans, Jr. et al.|
| 5,721,700 | A |   | 2/1998  | Katoh            |
| 5,790,367 | A |   | 8/1998  | Mateika et al.   |
| 5,817,572 | A |   | 10/1998 | Chiang et al.    |
| 5,990,761 | A |   | 11/1999 | Hamparian et al. |
| 6,018,282 | A |   | 1/2000  | Tsuda            |
| 6,077,737 | A |   | 6/2000  | Yang et al.      |
| 6,222,245 | B1|   | 4/2001  | Bez et al.       |

(Continued)

FOREIGN PATENT DOCUMENTS

JP    59-229914 A    12/1984

(Continued)

OTHER PUBLICATIONS

Notice of Grounds for Rejection, Japanese Patent Application No. 2003-541136, Feb. 19, 2008.

(Continued)

*Primary Examiner*—Wai-Sing Louie
*Assistant Examiner*—Bilkis Jahan
(74) *Attorney, Agent, or Firm*—Fenwick & West LLP

(57) ABSTRACT

Parallel plate tunable varactors having a bulk capacitance contribution to a total capacitance increased compared to a fringing capacitance contribution are disclosed. The contribution of the bulk capacitance to the total capacitance of an exemplary BST varactor is increased by increasing the area/perimeter ratio of the active region, thereby improving the tunability and other properties of the varactor. In an exemplary embodiment, an active region of the varactor has a lateral shape with a perimeter that is less than a perimeter of an equivalent area square. In various exemplary embodiments, the shape of the active region may be substantially circular or substantially octagonal. Methods for fabricating and designing such varactors are also disclosed.

15 Claims, 7 Drawing Sheets

U.S. PATENT DOCUMENTS

| | | | |
|---|---|---|---|
| 6,300,654 | B1 | 10/2001 | Corvasce et al. |
| 6,377,440 | B1 | 4/2002 | Zhu et al. |
| 6,383,858 | B1 | 5/2002 | Gupta et al. |
| 6,432,794 | B1 | 8/2002 | Lou |
| 6,451,665 | B1 | 9/2002 | Yunogami et al. |
| 6,452,776 | B1 * | 9/2002 | Chakravorty ............... 361/303 |
| 6,503,792 | B2 | 1/2003 | Hartner et al. |
| 6,646,499 | B2 | 11/2003 | Tiebout |
| 6,683,341 | B1 * | 1/2004 | York ......................... 257/312 |
| 6,737,930 | B2 | 5/2004 | Toncich |
| 7,042,701 | B2 | 5/2006 | Diorio et al. |
| 2001/0040249 | A1 | 11/2001 | Jung |
| 2001/0055852 | A1 | 12/2001 | Moise et al. |
| 2003/0067023 | A1 | 4/2003 | Olewine et al. |
| 2004/0087082 | A1 | 5/2004 | Nakata |
| 2004/0259316 | A1 | 12/2004 | Acikel et al. |
| 2006/0118841 | A1 | 6/2006 | Eliason et al. |
| 2007/0007853 | A1 * | 1/2007 | Toit et al. .................... 310/315 |

FOREIGN PATENT DOCUMENTS

| | | |
|---|---|---|
| JP | 10-209714 A | 8/1998 |
| WO | WO 00/28613 A1 | 5/2000 |

OTHER PUBLICATIONS

Acikel, Baki et al., "A New High Performance Phase Shifter using $Ba_xSr_{1-x}TiO_3$ Thin Films," IEEE Microwave and Wireless Components Letters, vol. 12, No. 7, Jul. 2002, pp. 237-239.

Acikel, Baki et al., "BST Varactor Design and Fabrication," project funded by DARPA FAME Program, 1 page [online], [retrieved on Jun. 28, 2004].Retrieved from the Internet <URL: http://my.ece.ucsb.edu/yorklab/Projects/Ferroelectrics/Devices/bstdevicedesign.htm>.

Acikel, Baki et al., "Overview of Program," DARPA FAME Program, 8 pages [online], [retrieved on Jun. 23, 2004]. Retrieved from the Internet <URL: http://my.ece.ucsb.edu/yorklab/Projects/Ferroelectrics/Devices/DeviceDesign.pdf>.

Acikel, Baki et al., "Technology Comparison," DARPA FAME Program, 6 pages [online], [retrieved on Jun. 23, 2004]. Retrieved from the Internet <URL: http://my.ece.ucsb.edu/yorklab/Projects/Ferroelectrics/Devices/VaractorComparison.pdf>.

Erker, Erich G. et al., "Monolithic Ka-Band Phase Shifter Using Voltage Tunable BaSrTiO3 Parallel Plate Capacitors," IEEE Microwave and Guided Wave Letters, vol. 10, No. 1, Jan. 2000, pp. 10-12.

IMS2000 Workshop "Ferroelectric Materials and Microwave Applications," 1 page [online], [retrieved on Jun. 28, 2004]. Retrieved from the Internet <URL: http://my.ece.ucsb.edu/yorklab/Projects/Ferroelectrics/IMS2000%20Workshop/ims2000_workshop.htm>.

Liu, Yu et al., "$BaSrTiO_3$ Interdigitated Capacitors for Distributed Phase Shifter Applications," IEEE Microwave and Guided Wave Letters, vol. 10, No. 11, Nov. 2000, pp. 448-450.

Liu, Yu et al., "High-performance and Low-cost Distributed Phase Shifters Using Optimized $BaSrTiO_3$ Interdigitated Capacitors," Electrical and Computer Engineering Dept., Materials Dept., University of California at Santa Barbara, Santa Barbara, CA 93106, 14 pages [online], [retrieved on Jun. 24, 2003]. Retrieved from the Internet <URL: http://my.ece.ucsb.edu/yorklab/Publications/pubs.htm>.

Nagra, Amit S. et al., "Distributed Analog Phase Shifters with Low Insertion Loss," IEEE Transactions on Microwave Theory and Techniques, vol. 47, No. 9, Sep. 1999, pp. 1705-1711.

Padmini, P. et al., "Realization of High Tunability Barium Strontium Titanate Thin Films by RF Magnetron Sputtering," Applied Physics Letters, vol. 75, Nov. 1999, pp. 3186-3188.

Serraiocco, J. et al., "Tunable Passive Integrated Circuits Using BST Thin Films," presented at IFFF 2002, International Joint Conference on the Applications of Ferroelectrics, Kyoto, Japan, May 2002, 10 pages [online], [retrieved on Jun. 24, 2003]. Retrieved from the Internet <URL: http://my.ece.ucsb.edu/yorklab/Publications/pubs.htm>.

Taylor, T. R. et al., "Impact of thermal strain on the dielectric constant of sputtered barium strontium titanate thin films," Applied Physics Letters, vol. 80, No. 11, Mar. 18, 2002, pp. 1978-1980.

Taylor, T. R. et al., "Optimization of RF Sputtered Barium Strontium Titanate (BST) Thin Films for High Tunability," presented at MRS Conference, Fall 1999, 2 pages [online], [retrieved on Jun. 24, 2003]. Retrieved from the Internet <URL: http://my.ece.ucsb.edu/yorklab/Publications/ pubs.htm>.

Taylor, T. R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.ece.ucsb.edu/yorklab/Publications/pubs.htm>.

Taylor, Troy et al., "BST Growth Optimization," project funded by DARPA FAME Program, 2 pages [online], [retrieved on Jun. 28, 2004]. Retrieved from the Internet <URL: http://my.ece.ucsb.edu/yorklab/Projects/Ferroelectrics/Materials/growthopt.htm>.

Taylor, Troy et al., "Loss Model for BST Test Capacitors," DARPA FAME Program, 6 pages [online], [retrieved on Jun. 23, 2004]. Retrieved from the Internet <URL: http://my.ece.ucsb.edu/yorklab/Projects/Ferroelectrics/Materials/LowFrequency.pdf>.

Taylor, Troy et al., "Materials Issues to Be Explored," DARPA FAME Program, 10 pages [online], [retrieved on Jun. 23, 2004]. Retrieved from the Internet <URL: http://my.ece.ucsb.edu/yorklab/Projects/Ferroelectrics/Materials/growth.pdf>.

York, Bob et al., "Thin-Film Ferroelectrics: Deposition Methods and Applications," presented at the International Microwave Symposium in Boston, MA, Jun. 2000, p. 20 [online], [retrieved on Jun. 23, 2004]. Retrieved from the Internet <URL: http://my.ece.ucsb.edu/yorklab/Projects/Ferroelectrics/IMS2000%20Workshop/Bob-oral.pdf>.

York, R. et al., "Books and Book Chapters," Microwave Electronics Lab, 4 pages [online], [retrieved on Jun. 23, 2004]. Retrieved from the Internet <URL: http://my.ece.ucsb.edu/yorklab/Publications/pubs.htm>.

York, R. et al. "Microwave Integrated Circuits using Thin-Film BST," presented at ISAF Conference, Honolulu, Hawaii, Jul. 21-Aug. 2, 2000, 6 pages [online], [retrieved on Jun. 24, 2003]. Retrieved from the Internet <URL: http://my.ece.ucsb.edu/yorklab/Publications/pubs.htm>.

York, Robert A. et al., "Synthesis and Characterization of $(Ba_xSr_{1-x})Ti_{1+y}O_{3+z}$, Thin Films and Integration into Microwave Varactors and Phase Shifters," Journal of Integrated Ferroelectrics, vol. 34, Apr. 10, 2000, pp. 177-188.

York, Robert A. et al., "Thin-Film Phase Shifters for Low-Cost Phased Arrays," presented at on Affordability and Cost Reduction for Radar Systems, Huntsville, Alabama, Apr. 2000 and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs. htm>.

* cited by examiner

VARACTOR DESIGN USING AREA TO PERIMETER RATIO FOR IMPROVED TUNING RANGE

CROSS-REFERENCE TO RELATED APPLICATIONS

This application claims priority under 35 U.S.C. §119(e) from co-pending U.S. Provisional Patent Application No. 60/719,791, entitled "Varactor Design Using Area/Perimeter Ratio for Improved Tuning Range," filed on Sep. 23, 2005, which is incorporated by reference herein in its entirety. This application is also related to U.S. patent application Ser. No. 10/822,563, "Fabrication of Parallel Plate Capacitors Using BST Thin Film," filed on Apr. 8, 2004, which is incorporated herein by reference in its entirety.

BACKGROUND OF THE INVENTION

1. Field of the Invention

This invention relates generally to designs for parallel plate voltage-variable capacitors (varactors), and more particularly, to the design of electrode geometries for parallel plate ferroelectric varactors to improve various performance characteristics such as tuning, reliability, and electrostatic discharge, and for high field testing.

2. Description of the Related Art

Capacitors are a basic building block for electronic circuits, and voltage-variable capacitors (varactors) have the added flexibility that their capacitance can be tuned by changing a bias voltage across the capacitor. Dielectric materials that have a permittivity that depends on the applied electric field can be used to form such varactors. Varactors have an added advantage that they can be easily integrated with other components, particularly if the dielectric layer is a thin film. One common approach to voltage-variable varactors is the "parallel-plate" configuration, in which the voltage-variable dielectric is sandwiched between two electrodes. For example, in an integrated varactor, one electrode may be a bottom conducting layer, the dielectric may be a ferroelectric thin film deposited over the bottom electrode, and the top electrode may be a metal layer.

In the parallel-plate configuration, the total capacitance of the varactor is determined primarily by the parallel combination of two components: a bulk capacitance due to the direct electric field between the two electrodes and a fringing or fringe capacitance due to the fringing electric field between the two electrodes. Ideally, the bulk capacitance should dominate over the fringing capacitance so that the bulk capacitance is the major contributor to the total capacitance of the varactor. This results in greater tunability of the varactor capacitance since the bulk capacitance typically is more tunable than the fringing capacitance.

The use of thin film ferroelectric layers of barium titanate, strontium titanate, and/or composites of the two (collectively referred to as "BST" materials) has led to smaller area varactors since the permittivity of such BST layers is high. In such varactors, however, the assumption that the bulk capacitance is the major contributor to the total capacitance may no longer hold true as the fringing capacitance begins to become a significant fraction of the total capacitance. This is especially true for small capacitance value varactors, because as the area that contributes to the bulk capacitance decreases, the fringing capacitance has a greater impact on the total capacitance.

Thus, there is a need for a thin film BST varactor that has a total capacitance determined in greater part by the bulk capacitance to improve tunability of the thin film BST varactor.

SUMMARY OF THE INVENTION

The present invention overcomes the limitations of the related art by providing a parallel-plate varactor in which the area of the active region, which contributes to a bulk capacitance, is increased or even maximized relative to the area that contributes to a fringing capacitance. Preferably, the BST varactor has a total capacitance determined predominantly by the bulk capacitance, which improves tunability and/or other properties of the thin film BST varactor.

In one aspect of the invention, a parallel plate tunable varactor includes a first electrode, a second electrode, and a tunable thin film dielectric layer between the first electrode and the second electrode. The tunable dielectric layer may be ferroelectric or paraelectric. The first electrode, the second electrode, and the dielectric layer are integrated on a substrate, and a permittivity of the dielectric layer varies according to a DC bias applied between the first electrode and the second electrode. The varactor includes an active region defined by an overlap of the first electrode, the second electrode, and the dielectric layer. The active region has a lateral shape, and a perimeter of the lateral shape is less than a perimeter of an equivalent square having the same area as the lateral shape.

In various exemplary embodiments, the lateral shape may be a polygon with at least five sides, for example, an octagon or substantially an octagon. It may also have rounded corners. In other embodiments, the active region has a lateral shape that is substantially circular, or the active region has a lateral shape including an area maximized compared to a perimeter.

In another aspect of the invention, an electronic device includes a substrate and a plurality of tunable ferroelectric thin film varactors integrated on the substrate. Each varactor has an area/perimeter ratio that is greater than a pre-selected ratio. For example, the pre-selected ratio may be a process design rule.

Other aspects of the invention include circuits including the varactors described above, applications of the foregoing, and methods corresponding to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE EMBODIMENTS

Thin film BST varactors, including methods of fabrication, with improved tunability, reliability, and/or decreased susceptibility to failure mechanisms such as electrostatic discharge (ESD) and high fields, are described herein.

Figure 1A:
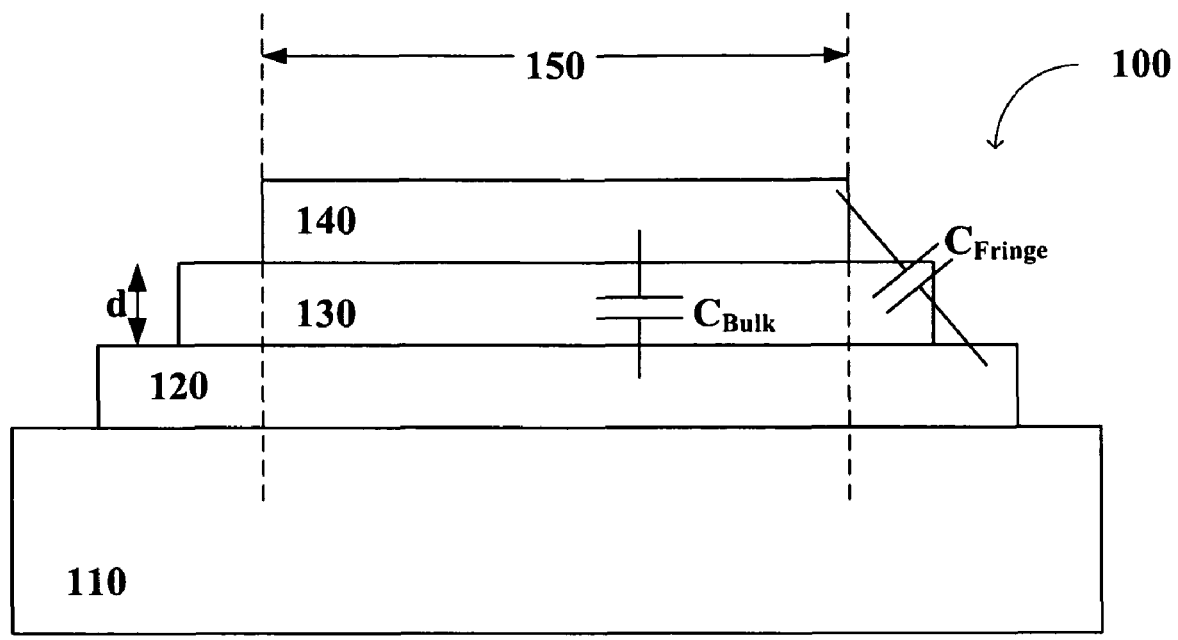
FIG. 1A is a cross-sectional view of an integrated parallel plate varactor formed on a substrate.

FIG. 1A is a cross-sectional view of an integrated parallel plate varactor 100 formed on a substrate 10. In the varactor 100, a bottom electrode 120 may be a conducting layer, a dielectric layer 130 may be a ferroelectric or paraelectric thin film dielectric positioned over the bottom electrode 120, and a top electrode 140 may be a metal layer positioned over the dielectric layer 130. For clarity, FIG. 1A does not show additional passivation, interconnect or other layers, which may also be present. In the varactor 100, the dielectric layer 130 is a tunable material. Applying a bias between the electrodes 120, 140 changes the properties of the tunable material of dielectric layer 130, thus generating a change in the capacitance of the varactor 100.

In particular, in the parallel-plate configuration, the capacitance of the varactor 100 is determined generally by the parallel combination of two components: a bulk capacitance ($C_{Bulk}$) and a fringing capacitance ($C_{Fringe}$). The bulk capacitance is determined primarily by the area of overlap of the top electrode 140, the dielectric layer 130, and the bottom electrode 120. For convenience, this area is referred to as an active region 150 of the varactor 100. In many designs, the active region 150 is determined mainly by the size and shape of the top electrode 140. In other designs, the active region 150 may be determined primarily by the bottom electrode 120. The dielectric layer 130 is typically shaped so that it does not additionally limit the active region 150, although this is not a requirement. For example, the dielectric layer 130 may or may not (as shown in FIG. 1A) extend beyond an edge the bottom electrode 120 or an edge of the top electrode 140. The fringing capacitance is due primarily to the fringing electric field between electrodes 120, 140 around the perimeter of the active region 150.

Figure 1B:
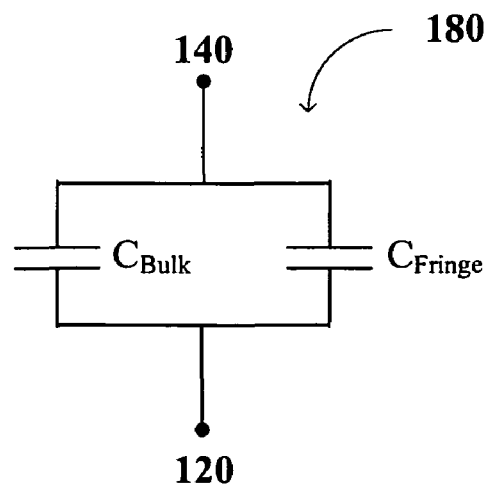
FIG. 1B is a circuit diagram of a capacitive model for the varactor of FIG. 1A.

FIG. 1B is a circuit diagram of a capacitive model 180 for the varactor 100 of FIG. 1A. The circuit diagram shows $C_{Bulk}$ coupled in parallel with $C_{Fringe}$. The total capacitance of the varactor 100 is given by $C_{Total}=C_{Bulk}+C_{Fringe}$. The bulk capacitance is generally given by $C_{Bulk}=\in A/d$, where $\in$ is the permittivity of the dielectric layer 130, A is the area of the active region 150, and d is the thickness of the dielectric layer 130. In the varactor 100, the permittivity $\in$ is dependent upon the electric field between electrodes 120, 140. Thus, the bulk capacitance is primarily set by adjusting the lateral dimensions of the top electrode 140 and/or the bottom electrode 120, and can be tuned by adjusting the voltage applied to electrodes 120, 140. The fringing capacitance, however, depends primarily on the physical geometry of the varactor 100 and is less affected by the voltage applied between electrodes 120, 140. Thus, it remains fairly constant (at least compared to the tunable range of the bulk capacitance).

Because the permittivity of BST layers can be so high, smaller area varactors can be fabricated. In such varactors, however, the assumption that the bulk capacitance is the major contributor to the total capacitance may no longer hold true as the fringing capacitance begins to become a significant fraction, for example, more than 5%, of the total capacitance. This is especially true for small capacitance value varactors because, as the lateral area that contributes to the bulk capacitance decreases, the fringing capacitance has a greater impact on the total capacitance.

To improve the tunability of the varactor 100, therefore, the goal is to fabricate a BST varactor that increases the contribution of the bulk capacitance compared to the fringing capacitance. This may be accomplished, for example, by minimizing the perimeter of the active region 150 compared to the area of the active region 150. In other words, the goal is to increase the area/perimeter ratio of the active region 150.

Figure 2A:
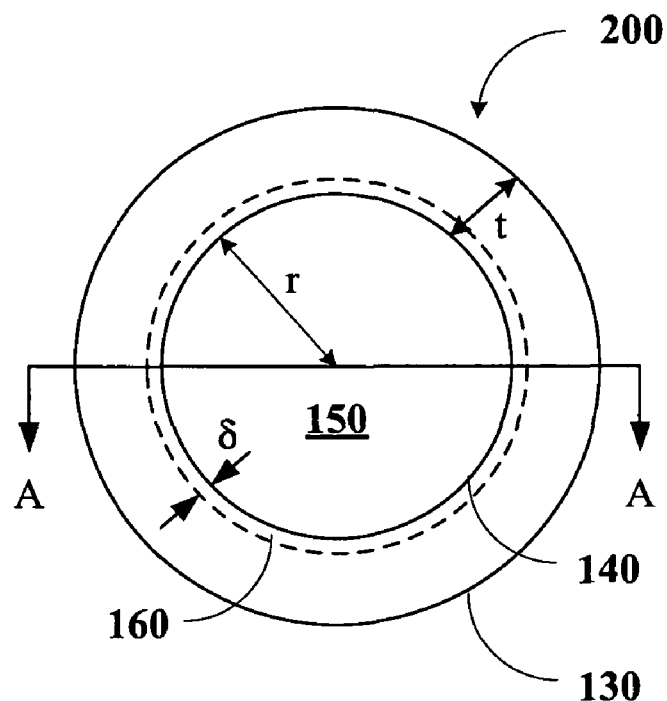
FIGS. 2A-2B are top views of exemplary varactors according to the present invention.
Figure 2B:
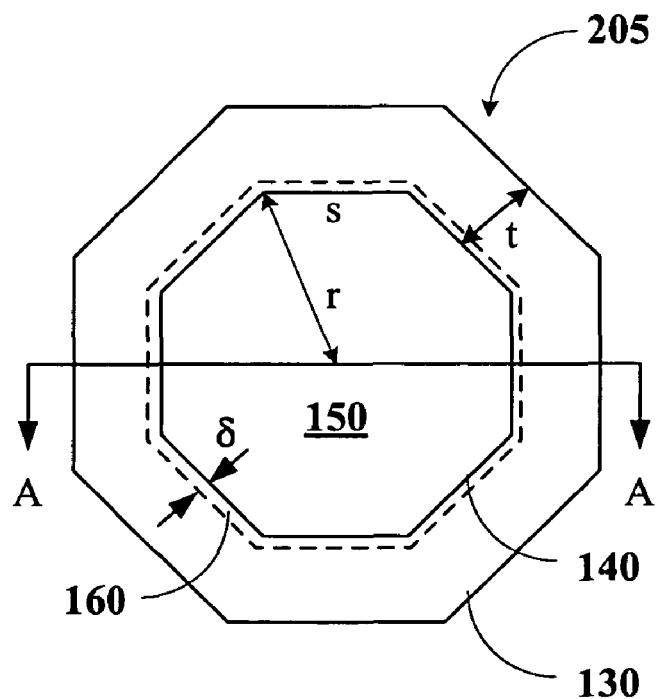

FIGS. 2A-2B are top views of exemplary varactors according to the present invention. FIG. 2A is a top view of a varactor 200 having a circular active area 150 with radius r. FIG. 2B is a top view of a varactor 205 having an octagonal active area 150 defined by a dimension r and a side length s. The depiction of a circle and an octagon in FIGS. 2A-2B is merely illustrative and not intended as a limitation. Other geometries will be apparent.

Each of the varactors 200 and 205 includes an active region 150 defined by the overlap between a top electrode 140, a dielectric layer 130, and a bottom electrode (not shown but assumed to be larger than the top electrode). The bottom electrode is assumed to be underlying the dielectric layer 130 and the top electrode 140, but the bottom electrode may wholly or partially extend beyond the perimeter of the top electrode 140. The dimension r in FIG. 2B is the radius of a circle that would circumscribe the active region 150. In the embodiments shown in FIGS. 2A-2B, due to the relative size and placement of the top electrode 150, dielectric layer 130 and bottom electrode, the lateral shape of the active region 150 matches the lateral shape of the top electrode 140.

Each of the varactors 200 and 205 also includes a fringing region 160 of lateral extent 8, through which the majority of the fringing field passes. The fringing region 160 extends around the perimeter of the active region 150. Each of the varactors 200 and 205 has a cross-sectional view through the line A-A as shown in FIG. 1A. Additionally, each of the varactors 200 and 205 can be modeled as shown in FIG. 1B.

Varactors 200 and 205 as shown in FIGS. 2A-2B are idealized representations. The actual top electrode geometries may deviate slightly from the idealized representations shown due to fabrication limitations. Although the final fabricated shape of the top electrodes 140 will affect the actual device properties, the idealized versions shown in FIGS. 2A-2B are useful to estimate actual device properties. In addition, while the discussion regarding FIGS. 2A-2B focuses on the shape of the top electrodes 140, the discussion would apply equally to the bottom electrodes 120 if, for example, the top electrodes 140 and the bottom electrodes 120 are interchanged.

Increasing the ratio of the bulk capacitance to the fringing capacitance will improve the tunability and/or other properties of a varactor. Where the permittivities of the active region 150 and the fringing region 160 are the same, which is true where the extent 6 of the fringing region 160 is less than the distance t that the dielectric layer 130 extends beyond the edge of the top electrode 140 as shown in FIGS. 2A-2B, the ratio of the bulk capacitance to the fringing capacitance is roughly proportional to the ratio of the area of the active region 150 to the area of the fringing region 160.

In FIGS. 2A-2B, the area of the active region 150 is given by the area of the top electrode 140. The area of the fringing region 160 is approximately given by the product P6, where P is the perimeter of the active region 150 (i.e., the perimeter of the top electrode 140 in FIGS. 2A-2B) and δ is the lateral extent of the fringing region 160. Table 1 shows the results of the ratio, R, of the area of the active region 150 to the area of the fringing region 160 for the varactors 200 and 205 of FIGS. 2A-2B. Also included in Table 1 are entries for an active region having the lateral shape of a regular polygon having a dimension r and n sides of length s. For comparison, the entries for a square of side length s, having a dimension r extending from a center point to a corner, are also included.

TABLE 1

A/Pδ Ratios for Different Varactor Shapes

| Geometry | Area | Perimeter | Dimension Relation | Ratio = A/Pδ |
|---|---|---|---|---|
| Circle | $\pi r^2$ | $2\pi r$ | $r = r$ | $(1/2)(r/\delta)$ |
| Octagon | $(8/2)r^2 \sin(360/8)$ | $8s$ | $s = 0.7654r$ | $(1/2.165)(r/\delta)$ |
| Regular polygon (dimension r and n sides of length s) | $(n/2)r^2 \sin(360/n)$ | $ns$ | $s = (2r)\cos[90 - (180/n)]$ | $\dfrac{\sin(360/n)r}{4\cos[90 - (180/n)]\delta}$ |
| Square | $s^2$ | $4s$ | $s = r\,\mathrm{sqrt}(2)$ | $(1/2.828)(r/\delta)$ |

As described above, the ratio of the bulk capacitance to the fringing capacitance is roughly proportional to the ratio A/Pδ. If δ is constant for two varactors being compared, then the ratio of capacitances is roughly proportional to the ratio A/P. As shown in Table 1, circular geometries maximize the A/P ratio for the specific class of varactor geometries described above.

For other geometries, the A/P ratio usually is a good metric for comparing alternate varactor shapes, even if the above assumptions do not strictly hold. For example, if the permittivities of the active region 150 and the fringing region 160 differ, for example, where the dielectric layer 130 does not extend beyond the top electrode 140 or the bottom electrode 120 in some areas, then the ratio of the areas may not be directly proportional to the ratio of the bulk capacitance to the fringing capacitance. However, increasing the area of the active region 150 compared to the area of the fringing region 160 or increasing the A/P ratio typically will still yield an improvement in varactor tunability.

Using the area and perimeter equations of the circle, octagon, and square from Table 1, the perimeter and A/P ratio of a circle and an octagon can be compared to an equivalent square, i.e., a square having the same area as the circle or octagon. The results are shown in Table 2. A circular active region has a perimeter that is about 11% smaller and an A/P ratio that is about 13% larger than those of an equivalent square. An octagonal active region has a perimeter that is about 9% smaller and an A/P ratio that is about 10% larger than an equivalent square.

Calculations similar to those used to produce the results of Table 2 can be performed to compare a square with rounded corners to its equivalent square. The rounded square is assumed to have a circumscribing square of side length L' composed of a smaller straight side of length L" plus two corner radiuses r. That is, L'=L"+2r. The equivalent square has a side length L and an area equivalent to the area of the rounded square. The results, summarized in Table 3 and assuming L'=1, depend on the radius r of the rounded corner. For example, for a rounded square having a corner radius that is 10% of the side length L' (top row of Table 3), the rounded square, which resembles the equivalent square in shape, has a perimeter that is about 3.9% smaller and an A/P ratio that is about 4% larger than its equivalent square. A rounded square having a corner radius that is 25% of the side length L' has a perimeter that is about 8% smaller and an A/P ratio that is about 9% larger than its equivalent square. A rounded square having a corner radius that is 40% of the side length L', and beginning to look more like a circle, has a perimeter that is about 11% smaller and an A/P ratio that is about 12% larger than its equivalent square. A rounded square having a corner radius that is 50% of the side length L' is a circle, and yields the same results as shown for the circle in Table 2 above.

TABLE 2

Perimeter and A/P Comparison for Circle or Octagon to Equivalent Square

| Geometry | Area | Perimeter | A/P | $A_{sqr} = A_{cir/oct}$ | $\dfrac{P_{cir/oct} - P_{sqr}}{P_{sqr}}$ | $\dfrac{A/P_{cir/oct} - A/P_{sqr}}{A/P_{sqr}}$ |
|---|---|---|---|---|---|---|
| Circle | $\pi r^2$ | $2\pi r$ | $r/2$ | $L = r\,\mathrm{sqrt}(\pi)$ | −11.38% | 12.84% |
| Octagon | $4r^2 \sin(45)$ | $8s = 8(0.77r)$ | $\dfrac{4r \sin(45)}{6.12}$ | $L = 2r\,\mathrm{sqrt}(\sin(45))$ | −8.98% | 9.86% |
| Square | $L^2$ | $4L$ | $L/4$ | | | |

TABLE 3

Perimeter and A/P Comparison for Rounded Square to Equivalent Square

| Corner Radius r | Side L" = L' − 2r | Area = $\pi r^2$ + 4rL" + L"$^2$ | Perimeter = $2\pi r$ + 4L" | A/P | $\dfrac{P_{rnd\,sqr} - P_{sqr}}{P_{sqr}}$ | $\dfrac{A/P_{rnd\,sqr} - A/P_{sqr}}{A/P_{sqr}}$ |
|---|---|---|---|---|---|---|
| 0.1 | 0.8 | 0.991 | 3.828 | 0.259 | −3.88% | 4.04% |
| 0.25 | 0.5 | 0.946 | 3.571 | 0.265 | −8.23% | 8.97% |
| 0.4 | 0.2 | 0.863 | 3.313 | 0.260 | −10.82% | 12.13% |
| 0.5 | 0 | 0.785 | 3.142 | 0.250 | −11.38% | 12.84% |

By increasing the A/P metric, the bulk capacitance, which depends on the area of the active region 150, will be a larger portion of the total capacitance, allowing increased tunability of the varactor. While varactors may be fabricated as a plurality of cells comprising a single varactor, Tables 1, 2, and 3 are consistent with the notion that a single circular active region is preferable for improved tunability of the varactor capacitance.

Figure 3A:
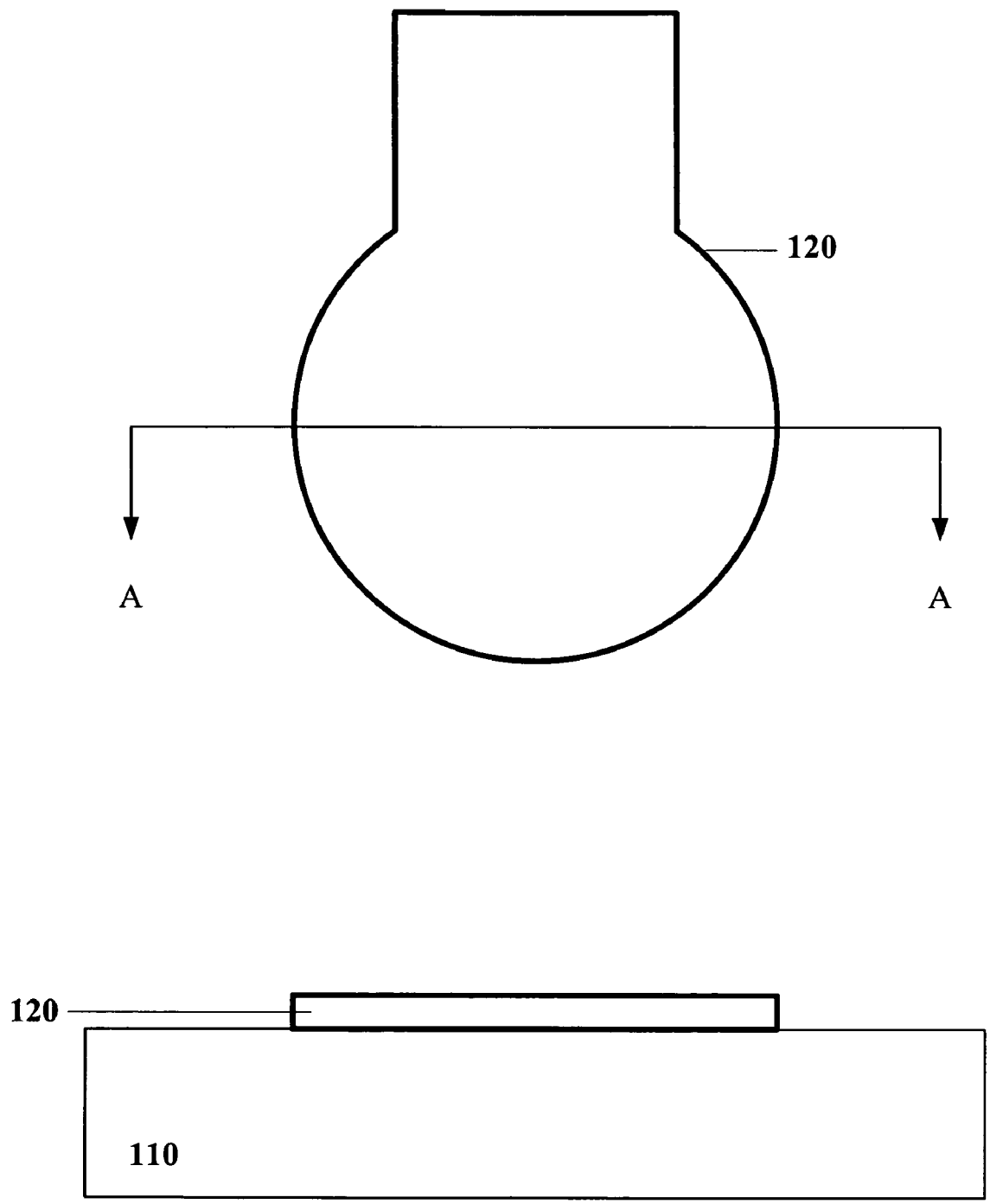
FIGS. 3A-3C are top view and cross-sectional view pairs illustrating fabrication of the varactor of FIG. 2A.
Figure 3B:
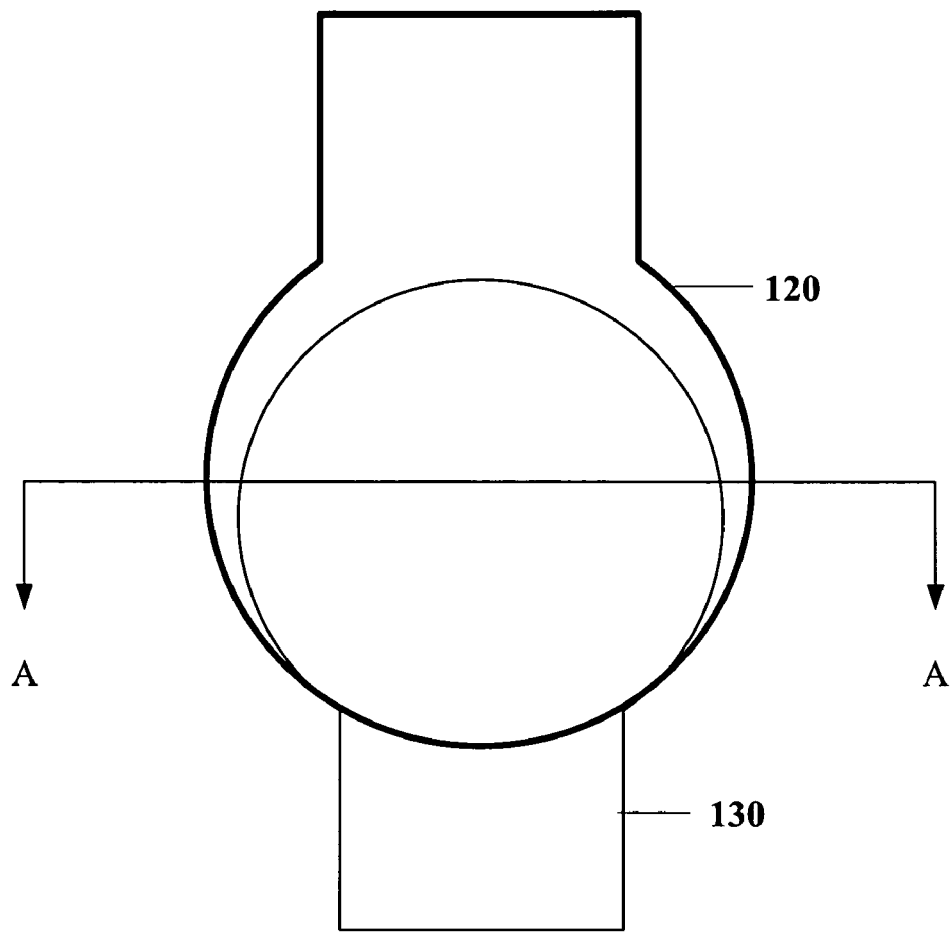
Figure 3B:
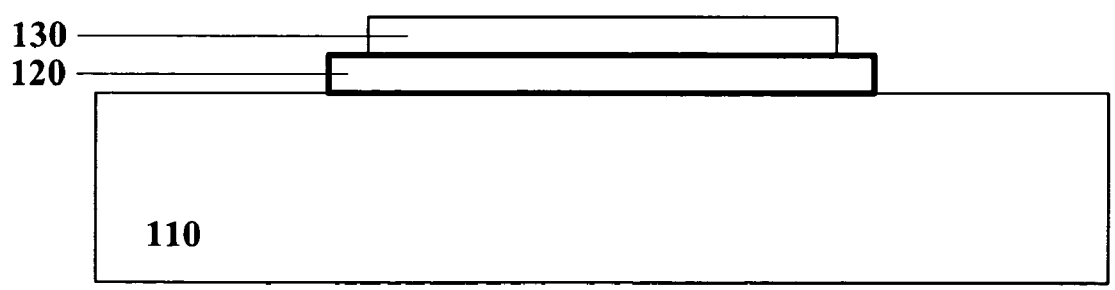
Figure 3C:
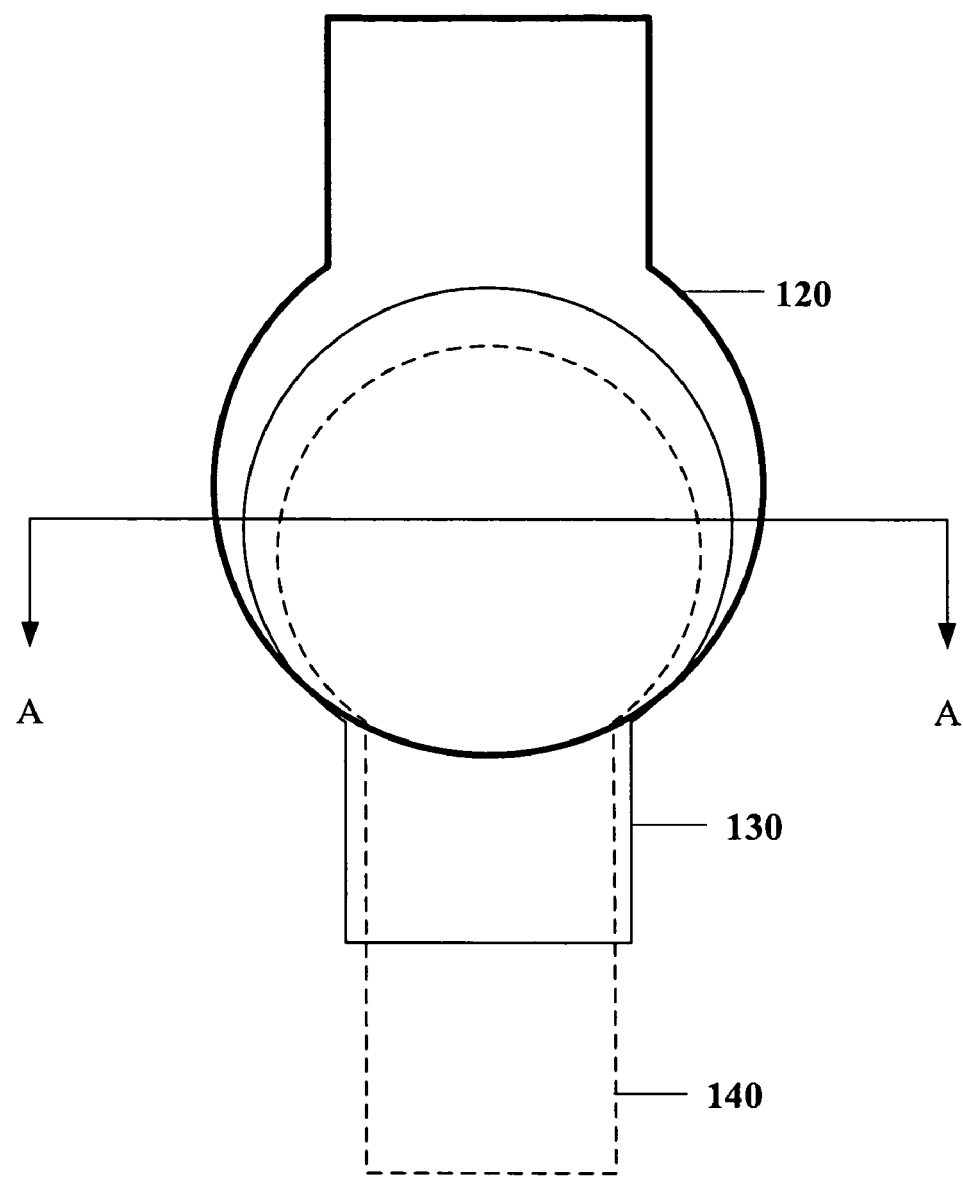
Figure 3C:
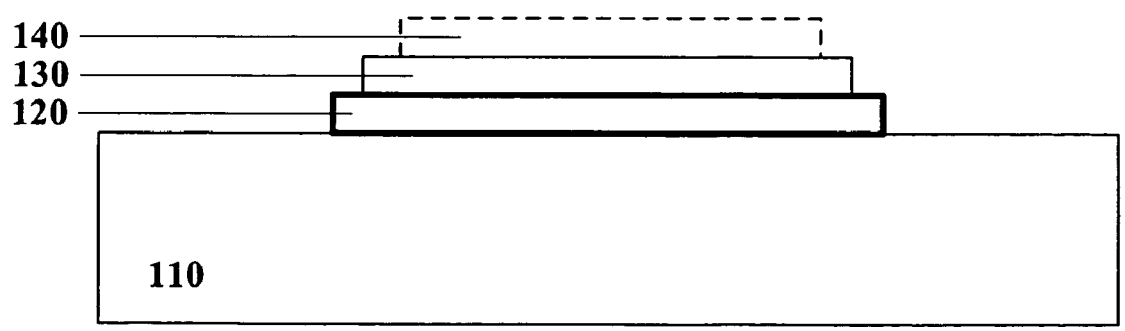

FIGS. 3A-3C are top view and cross-sectional view pairs illustrating fabrication of the varactor 200 of FIG. 2A. Each individual figure shows a different phase of fabrication, while the sequence of figures shows the overall fabrication process. Each figure shows both a top view and a corresponding cross-sectional view, through the line A-A, of the capacitor during fabrication. The fabricated capacitor is shown in the last figure of the sequence.

Referring to FIG. 3A, the process begins with the substrate 110, which may be, for example, high-resistivity silicon (HR Si), crystalline sapphire ($Al_2O_3$), aluminum nitride (AlN), quartz, glass, or another substrate. These substrates are preferably polished for low surface roughness for compatibility with growth of smooth ferroelectric films with high breakdown fields.

Still referring to FIG. 3A, the bottom electrode 120 is formed on the substrate 110. In one approach, a layer of material for the bottom electrode 120 is formed over the substrate 110, and selected lateral portions of the bottom electrode layer are then removed, for example by etching, thus forming the lateral shape of the bottom electrode 120. In an alternative approach, a lift off process may be used. A lift off mask that defines the lateral shape of the bottom electrode 120 is formed over the substrate 110. A layer of bottom electrode material is deposited over the lift off mask. Removing the lift off mask also removes the bottom electrode material in certain areas, thus forming the lateral shape of the bottom electrode 120. In one embodiment, the bottom electrode 120 is a thin layer of platinum. A thin layer is preferred to minimize roughness during subsequent processing, while platinum provides compatibility with subsequent BST processing. Due to limitations of patterning tools, the perimeter of the bottom electrode 120 may not be perfectly circular. For example, it may be substantially circular with a pixelized edge.

Referring to FIG. 3B, the BST thin film dielectric layer 130 is deposited or grown over the bottom electrode 120 using conventional deposition or growth techniques and conventional patterning techniques. Due to limitations of patterning tools, the perimeter of the dielectric layer 130 may not be perfectly circular. Examples of suitable BST thin film materials for BST thin film dielectric layer 130 include barium titanate, strontium titanate, and composites of the two. For convenience, the term "BST" is used throughout to refer to all of these materials even though, strictly speaking, barium titanate does not contain strontium and strontium titanate does not contain barium. The BST materials can also include concentrations of one or more other elements to modify the material properties.

Referring to FIG. 3C, the top electrode 140 is formed overlying the BST thin film dielectric layer 130 and the bottom electrode 120. The top electrode 140 may be formed, for example, using a lift off process, in which a lift off mask is deposited and patterned prior to deposition of a top electrode conductive layer. Removal of the lift off mask leaves the patterned top electrode 140. Alternatively, the top electrode 140 may be formed using standard photolithography and etch techniques in which the conductive material is deposited prior to the patterned photoresist and selected portions of the conductive layer are etched away to form the lateral shape of the top electrode 140. Due to limitations of patterning tools, the perimeter of the top electrode 140 may not be perfectly circular.

In one embodiment, the top electrode 140 may be a layer of gold, which may also be used to form a separate contact layer (not shown) to the bottom electrode 120. Alternatively, the top electrode 140 may be a thin layer of platinum, and an additional gold layer may be deposited to form separate contact layers to each of the electrodes 120, 140 to provide lower resistance contacts to the electrodes 120, 140. Examples of additional fabrication techniques are described in U.S. patent application Ser. No. 10/822,563, entitled "Fabrication of Parallel Plate Capacitors Using BST Thin Films" filed on Ap. 8, 2004.

Figure 4:
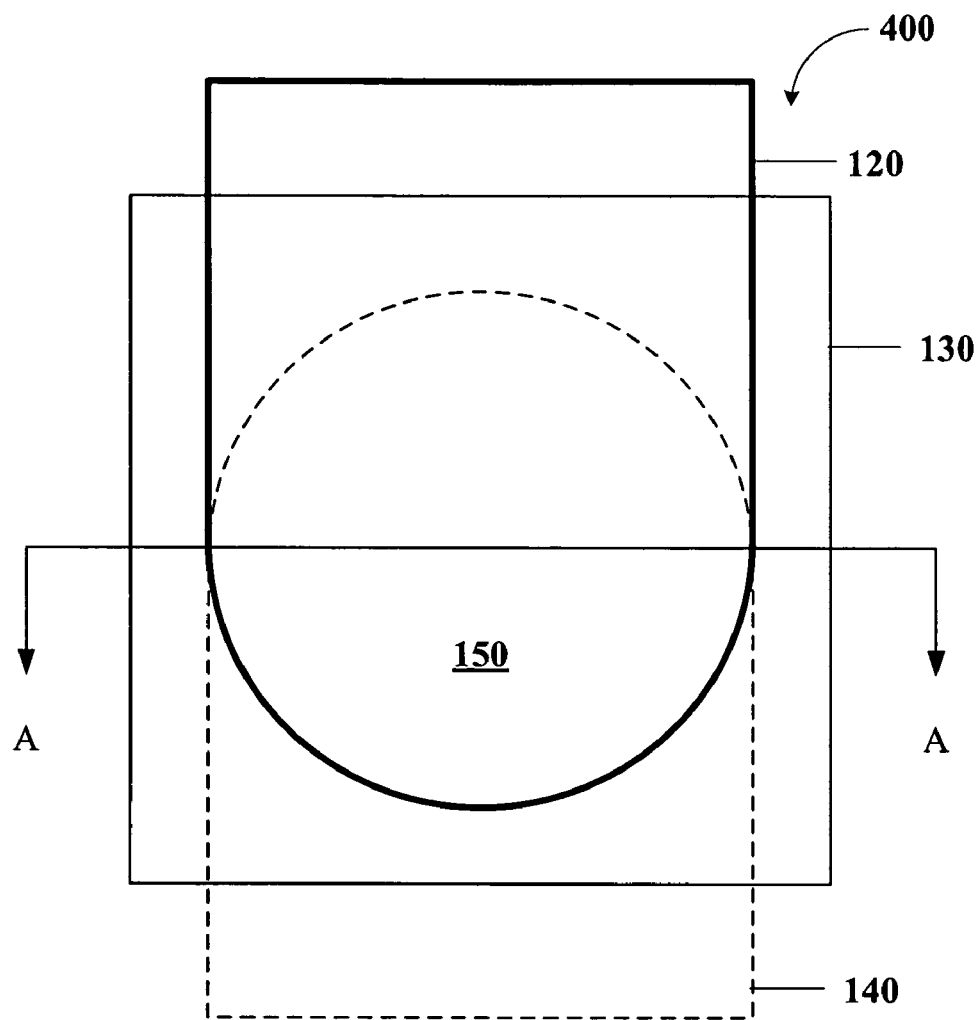
FIG. 4 is a top view and cross-sectional view pair of another embodiment of a varactor according to the present invention.
Figure 4:
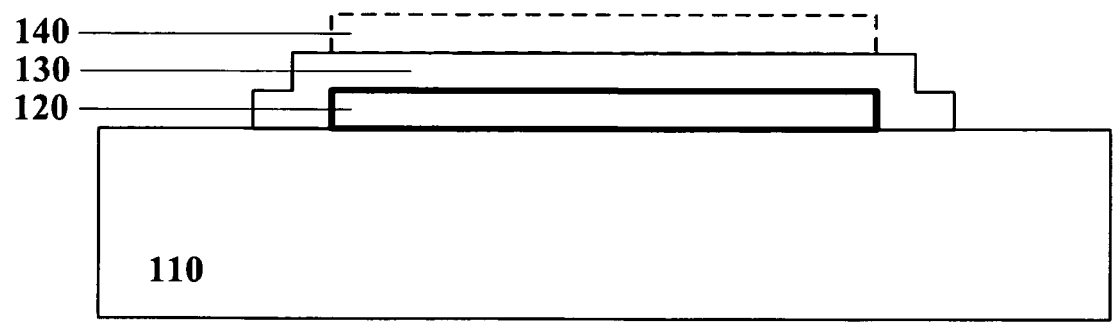

FIG. 4 is a top view and cross-sectional view pair of another embodiment of a varactor 400 according to the present invention. The varactor 400 may be fabricated using a process similar to that described in FIGS. 3A-3C. The varactor 400 includes a bottom electrode 120, a top electrode 140, and a dielectric layer 130 sandwiched between the electrodes 120, 140. The top electrodes 140 and the bottom electrode 120 are each shaped as a rectangle with a half circle at one end. Overlapping the circular ends of the electrodes 120, 140 produces an active region 150 that is circular in shape, similar to the varactor 200 of FIG. 2A. The dielectric layer 130 is shown in FIG. 4 with a square shape, but it may have any shape that does not additionally limit the active area 150.

Figure 5:
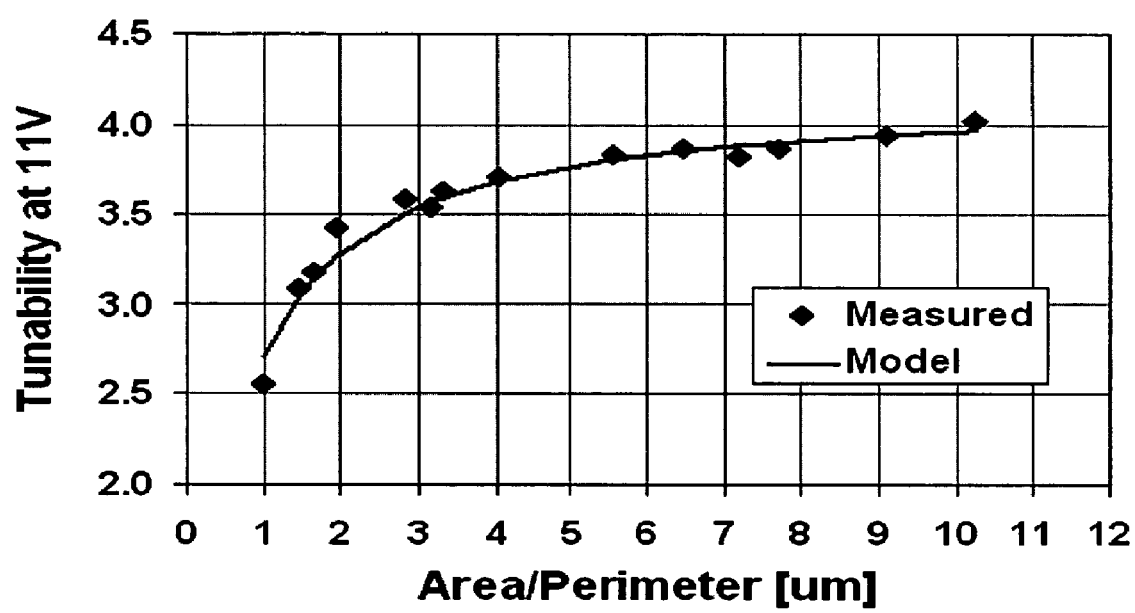
FIG. 5 is a graph of varactor tunability for BST thin film varactors as a function of the area/perimeter ratio.

Data was collected from a series of varactor designs from a particular process where the actual, fabricated dimensions of the top electrode, which happened to define the active region, were used to generate the area/perimeter ratio of the active region. FIG. 5 is a graph of varactor tunability for the BST thin film varactors as a function of the area/perimeter ratio. Tunability is defined as the capacitance at 0V divided by the capacitance at 11V. As demonstrated in FIG. 5, a larger area/perimeter ratio yielded increased tunability of the varactors.

Although the curve in FIG. 5 is process specific and different processing techniques for tunable capacitors can impact the curve, the general trend, e.g., the shape of the curve, applies to tunable varactors fabricated with varying process techniques. This drives the device design toward circular shapes, since a circular geometry maximizes the area/perimeter ratio of the active region, defined in these devices by the top electrode. Actual circles may not be easily designed into a processing mask, however, thus a shape imitating or approximating a circle, such as an octagon, may be used.

The data in FIG. 5 also shows that for the particular fabrication process used to fabricate the BST varactors, the tunability of the varactors dropped rapidly for an area/perimeter ratio lower than about four micrometers in this particular example. This suggests that for a particular process, a particular area/perimeter ratio may be pre-selected as a design rule such that varactor designs meeting or exceeding the design rule will exhibit improved tunability. The drop off below four micrometers also implies that highly tunable varactors may be difficult to make for small value capacitors or where small sizes are indicated. Other circuit designs can be used to circumvent this problem. For example, coupling a number of larger value capacitors in series results in a smaller capacitance with higher tunability than would be possible with a single capacitor.

Failure of thin film BST capacitors under high electric fields is related to the shape of the capacitor electrodes. High field failures often occur at electrode corners, consistent with ESD or reliability testing, implying that the corners concentrate the electric field and become the weakest part of the structure. By defining the electrodes with no corners, or at least rounded corners, an increase in reliability is possible. Circular electrodes are, therefore, also preferred for increased reliability.

Capacitor leakage is also directly related to the perimeter of the electrodes. To design a capacitor for low leakage, the electrode perimeter should be minimized for a given capacitance. Therefore, a circular electrode geometry is also favored for reduced leakage.

Although the invention with respect to parallel plate BST varactors has been described in considerable detail with reference to certain preferred embodiments thereof, other embodiments will be apparent. For example, the varactors in FIGS. 2A-2B are drawn with specific shapes for the electrodes 120, 140, and the dielectric layer 130. However, this is not meant as a limitation since the specific geometries and shapes shown are not required, and other geometries are possible. In particular, the discussion of FIGS. 2A-2B focused on the top electrode geometry, but the discussion is equally applicable to the bottom electrode. Also, the dielectric layer may or may not extend, wholly or partially, beyond the perimeter of the top and/or bottom electrode. In addition, the bottom electrode may or may not extend, wholly or partially, beyond the perimeter of the top electrode. As a further example, the geometries of the bottom electrode 120 and the dielectric layer 130 need not match the geometry of the top electrode 140.

Furthermore, the figures show the most relevant structures of the varactors, but this does not imply that other structures or layers do not exist. For example, additional layers located between those shown may be used for various purposes according to conventional techniques. Examples include layers to increase adhesion, to provide a diffusion barrier, or to improve the Schottky barrier height. As another example, the bottom electrode 120 is always shown as supported directly by the substrate 110. This is for convenience, and other layers or structures can be located between the bottom electrode 120 and the substrate 110. In addition, each layer 120, 130, 140 can also include one or more types of materials, although they are shown and described as single layers of material.

Furthermore, fabrication processes are not required to use all of the processing techniques discussed. Various embodiments can use only some of the techniques. Additionally, further fabrication steps beyond those described may be included, for example, to facilitate passivation or interconnection of the fabricated varactor.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes, and variations that will be apparent to those skilled in the art may be made in the arrangement, operation, and details of the present invention disclosed herein without departing from the spirit and scope of the invention as defined in the appended claims. Therefore, the scope of the invention should be determined by the appended claims and their legal equivalents.

What is claimed is:

1. A parallel plate tunable varactor, the varactor comprising:
   a first electrode;
   a second electrode;
   a thin film dielectric layer between the first electrode and the second electrode, wherein the first electrode, the second electrode, and the dielectric layer are integrated on a substrate, and a permittivity of the dielectric layer varies according to a DC bias applied between the first electrode and the second electrode; and
   an active region defined by an overlap of the first electrode, the second electrode, and the dielectric layer, the active region having a lateral shape, wherein a perimeter of the lateral shape is less than a perimeter of an equivalent square having a same area as the lateral shape, and a ratio of an area of the lateral shape to the perimeter of the lateral shape is not less than four micrometers.

2. The varactor of claim 1, wherein the thin film dielectric layer comprises at least one of the materials selected from a group consisting of: barium titanate (BT), strontium titanate (SI), and barium strontium titanate (BST).

3. The varactor of claim 1, wherein at least one of the electrodes comprises platinum.

4. The varactor of claim 1, wherein the perimeter of the lateral shape is at least 39% less than the perimeter of the equivalent square.

5. The varactor of claim 1, wherein the perimeter of the lateral shape is at least 8% less than the perimeter of the equivalent square.

6. The varactor of claim 1, wherein the lateral shape is a polygon with at least five sides.

7. The varactor of claim 6, wherein the lateral shape is an octagon.

8. The varactor of claim 6, wherein the lateral shape is a heptagon, a hexagon, or a pentagon.

9. The varactor of claim 1, wherein the lateral shape is a polygon with at least eight sides.

10. The varactor of claim 1, wherein the first electrode is a top electrode and the active region is defined by the top electrode.

11. The varactor of claim 1, wherein fringe capacitance comprises at least 5% of a total capacitance of the varactor.

12. The varactor of claim 1, wherein fringe capacitance comprises at least boo of a total capacitance of the varactor.

13. The varactor of claim 1, wherein fringe capacitance comprises at least 15% of a total capacitance of the varactor.

14. The varactor of claim 1, wherein fringe capacitance comprises at least 25% a total capacitance of the varactor.

15. The varactor of claim 1, wherein each one of a plurality of corners defining the lateral shape is rounded.

\* \* \* \* \*

UNITED STATES PATENT AND TRADEMARK OFFICE
CERTIFICATE OF CORRECTION

PATENT NO. : 7,728,377 B2  Page 1 of 1
APPLICATION NO. : 11/511568
DATED : June 1, 2010
INVENTOR(S) : Christopher R. Elsass and Robert Armstrong York It is certified that error appears in the above-identified patent and that said Letters Patent is hereby corrected as shown below:

Column 10, Line 37, claim 2, please replace "(SI)", with --(ST)--

Column 10, Line 39, claim 4, please replace "39%" with --3.9%--

Column 10, Line 57, claim 12, please replace "boo" with --10%--

Signed and Sealed this

Twenty-eighth Day of September, 2010

David J. Kappos
*Director of the United States Patent and Trademark Office*